United States Patent
Ifis

(10) Patent No.: US 10,950,463 B2
(45) Date of Patent: Mar. 16, 2021

(54) MANUFACTURING TRAPEZOIDAL THROUGH-HOLE IN COMPONENT CARRIER MATERIAL

(71) Applicant: AT&S Austria Technologie & Systemtechnik Aktiengesellschaft, Leoben (AT)

(72) Inventor: Abderrazzaq Ifis, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/263,204

(22) Filed: Jan. 31, 2019

(65) Prior Publication Data

US 2020/0251351 A1  Aug. 6, 2020

(51) Int. Cl.
| | | |
|---|---|---|
| *H01L 21/48* | (2006.01) | |
| *H05K 3/40* | (2006.01) | |
| *H05K 3/42* | (2006.01) | |
| *H05K 3/00* | (2006.01) | |
| *H05K 3/46* | (2006.01) | |

(52) U.S. Cl.
CPC ........ *H01L 21/4857* (2013.01); *H01L 21/486* (2013.01); *H05K 3/4069* (2013.01); *H05K 3/422* (2013.01); *H05K 3/0032* (2013.01); *H05K 3/4602* (2013.01); *H05K 2201/09818* (2013.01); *H05K 2203/107* (2013.01)

(58) Field of Classification Search
CPC ............. H05K 3/42; H05K 3/422–428; H05K 2201/09854; H05K 3/09827; H05K 2203/1453; H05K 3/4038; H05K 1/115; H05K 3/0094; H01L 2201/09563
See application file for complete search history.

(56) References Cited

U.S. PATENT DOCUMENTS

| | | | | |
|---|---|---|---|---|
| 2003/0135994 A1* | 7/2003 | Shutou | ................. | H05K 3/4602 29/830 |
| 2004/0089948 A1* | 5/2004 | Cheng | ................... | H01L 21/486 257/758 |

(Continued)

FOREIGN PATENT DOCUMENTS

TW          200539771 A     12/2005

*Primary Examiner* — Alia Sabur
(74) *Attorney, Agent, or Firm* — Robert A. Blaha; Smith Tempel Blaha LLC

(57) ABSTRACT

A method of manufacturing a component carrier is disclosed. The method includes providing an electrically insulating layer structure having a front side and a back side, wherein the front side is covered by a first electrically conductive layer structure and the back side is covered by a second electrically conductive layer structure, carrying out a first opening process, such as a first laser drilling, through the first electrically conductive layer structure and into the electrically insulating layer structure from the front side to thereby form a blind hole in the electrically insulating layer structure, and thereafter carrying out a second opening process, such as a second laser drilling, through the second electrically conductive layer structure and through the electrically insulating layer structure from the back side to thereby extend the blind hole into a through hole, in particular a laser through hole, with substantially trapezoidal shape.

20 Claims, 2 Drawing Sheets

(56) References Cited

U.S. PATENT DOCUMENTS

| | | | |
|---|---|---|---|
| 2007/0074902 A1* | 4/2007 | Hirata | H05K 3/427 |
| | | | 174/262 |
| 2012/0005889 A1* | 1/2012 | Takahashi | H05K 1/115 |
| | | | 29/829 |
| 2012/0097319 A1 | 4/2012 | Maeda | |
| 2014/0178566 A1 | 6/2014 | Kodama | |
| 2016/0330836 A1* | 11/2016 | Mizutani | H05K 3/187 |
| 2018/0242453 A1* | 8/2018 | Lee | H05K 1/111 |

\* cited by examiner

MANUFACTURING TRAPEZOIDAL THROUGH-HOLE IN COMPONENT CARRIER MATERIAL

TECHNICAL FIELD

The invention relates to a method of manufacturing a component carrier and to a component carrier.

Technological Background

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

Moreover, it may be advantageous to efficiently contact electrically conductive layer structures and/or components embedded in a component carrier with proper quality. Formation of mechanical vias and laser vias, which may be filled with copper, may be advantageous for these and other purposes. However, it is desired that electric connections in a component carrier are reliable.

SUMMARY

There may be a need for an electric connection in a component carrier with high electric reliability.

According to an exemplary embodiment of the invention, a method of manufacturing a component carrier is provided, wherein the method comprises providing an electrically insulating layer structure having a front side and a back side, wherein the front side is covered by a first electrically conductive layer structure and the back side is covered by a second electrically conductive layer structure, carrying out a first opening process (in particular a first laser drilling) through the first electrically conductive layer structure and into the electrically insulating layer structure from the front side to thereby form a blind hole in the electrically insulating layer structure, and thereafter carrying out a second opening process (in particular a second laser drilling) through the second electrically conductive layer structure and through the electrically insulating layer structure from the back side to thereby extend the blind hole into a through hole (in particular a laser through-hole) with a substantially trapezoidal shape.

According to another exemplary embodiment of the invention, a component carrier is provided which comprises an electrically insulating layer structure having a front side and a back side, a first electrically conductive layer structure covering the front side of the electrically insulating layer structure, a second electrically conductive layer structure covering the back side of the electrically insulating layer structure, a through hole (in particular a laser through-hole) having a substantially trapezoidal shape extending through the first electrically conductive layer structure, the electri-
cally insulating layer structure and the second electrically conductive layer structure, and electrically conductive filling material filling at least part of the through hole (in particular laser through-hole) (i.e., filling only part of the through hole while keeping another part free of the filling material, or filling the entire through hole with the filling material), wherein material interfaces are formed in interface regions between the first electrically conductive layer structure and the electrically conductive filling material and between the second electrically conductive layer structure and the electrically conductive filling material.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "laser drilling" may particularly denote removing material of an electrically conductive layer structure and/or an electrically insulating layer structure by directing a laser beam on the respective layer structure. The energy of the laser beam then removes material of the respective layer structure to thereby form a corresponding drilling hole.

In the context of the present application, the term "blind hole" may particularly denote a hole which has a closed bottom. More specifically, a blind hole in the electrically insulating layer structure may refer to a hole that is formed to a specified depth without breaking through to the other side of the electrically insulating layer structure.

In the context of the present application, the term "through hole" may particularly denote a hole which has an open bottom. More specifically, a through hole extending through the electrically insulating layer structure and the electrically conductive layer structures may refer to a hole that is formed to extend completely through the material of the electrically insulating layer structure and the electrically conductive layer structures, and which may be formed in particular and preferably by laser processing. Thus, the through hole may be a laser through hole. A through hole may be manufactured for instance by a combination of laser shots from the front side and the back side, i.e., from the two opposing main surfaces, of the layer structures. One or more laser shots may be performed from each of these sides. Formation of a through hole by laser processing from only one main surface may be possible as well. Furthermore, formation of a through hole may be carried out as well by other methods than laser processing, for instance by a plasma treatment.

In the context of the present application, the term "through hole with substantially trapezoidal shape" may particularly denote a through hole extending through the electrically insulating layer structure and the electrically conductive layer structures and having the shape of a trapezoid in a cross-section perpendicular to main surfaces of the layer structures. A trapezoid may be denoted as a convex quadrilateral with a pair of parallel sides, wherein the remaining two sides may be not parallel to each other. The parallel sides may be also parallel to the layer structures, wherein the non-parallel sides may extend in a slanted way through the electrically insulating layer structure. In a three-dimensional view, the through hole (when filled with electrically conductive filling material) may have substantially the shape of a truncated cone (or in other words of a frustum of a cone). However, a skilled person will understand that a substantially trapezoidal shape may show slight deviations from a strict trapezoidal shape, and may for instance be shaped as a slightly asymmetrical trapezoid. A reason for such a slight deviation may be a slight offset between front side laser processing and back side laser processing of the electrically insulating layer structure. Such an offset may result, in turn, from alignment inaccuracies, etc.

In the context of the present application, the term "material interface" may particularly denote an area at which the surface of one material structure abuts against the surface of another material structure. The abutting materials may be different materials or may be the same material (for instance copper). However, a copper/copper interface of different copper structures is still visible in a cross-sectional view of the component carrier. For instance, one of the copper structures may be a patterned copper foil, wherein the other copper structure may be plated copper (in particular formed by galvanic plating). As known by a person skilled in the art, the formation of plated copper may be further promoted by previously forming a very thin seed layer (for instance by electroless deposition). Even if such an extremely thin seed layer is present between the two described copper structures—as example for the material structures having a material inter-face in between—a skilled person will still consider the two described copper structures (in the example a patterned copper foil and copper formed by galvanic plating) as having a material interface in between.

According to an exemplary embodiment, a through hole of substantially trapezoidal cross-sectional shape is formed in a stack composed of a central electrically insulating layer structure covered with two electrically conductive layer structures on opposing main surfaces. For manufacturing such a through hole, a window in one of the electrically conductive layer structures can be firstly opened by a first opening process (in particular a first laser beam) which removes additionally only a small portion of the material of the electrically insulating layer structure under the window. This first opening process (in particular first laser treatment) may be followed by a second opening process (in particular a second laser treatment with a second laser beam) from a back side, which may complete formation of the trapezoidal through hole. Preferably, the first opening process can be a laser process (but can be also another material removal process), whereas the second opening process may preferably also be a laser process (but can be also another material removal process).

A subsequent process of filling the manufactured through hole with an electrically conductive material such as plated copper can be carried out highly efficiently and without the risk of forming large voids in the hole. However, characteristic material interfaces between the electrically conductive layer structures (for instance patterned copper foils) on the one hand and the electrically conductive filling medium (for instance copper formed by galvanic plating) on the other hand may be the fingerprint of the described process.

By adjusting the first laser beam, as a preferred embodiment of the first opening process, with a sufficiently small energy or power for ensuring that the first laser shot does not extend up to the opposing electrically conductive layer structure, undesired reflection of the laser beam at the opposing electrically conductive layer structure and undesired melting of the opposing electrically conductive layer structure as a result of the energy impact of the laser beam can be prevented. By preventing the first laser beam from reaching the opposing electrically conductive layer structure, reliability issues of the formed laser through hole can be safely prevented.

More generally, exemplary embodiments of the invention may use different laser beams for laser drilling from front side and back side with a well-controlled ratio to avoid laser reflection and/or laser induced melting under the opening in the electrically conductive layer structure (in particular a copper opening). Even more generally, exemplary embodiments of the invention may use another material removal technology rather than laser irradiation for the first opening process and/or for the second opening process. Highly advantageously, substantially no additional effort in terms of hardware and processing resources is required to carry out the described process.

An exemplary embodiment of the invention provides a component with a trapezoid hole in an electrically insulating layer structure to obtain a reliable laser through-hole. This may be in particular advantageous for thin cores (i.e., for electrically insulating layer structures having a thickness of less than 100 µm, in particular less than 60 µm). The manufactured laser via has a trapezoidal shape with the lower width being larger than the upper width. Such a trapezoidal laser through hole can be formed in particular by a two-stage laser drilling method: First laser drilling from the front side for forming a shallow blind hole. Thereafter, laser drilling from the back side for extending the blind hole up to a through hole. Optionally, it is subsequently possible to partially or entirely fill the laser through hole with electrically conductive material. For instance, this can be accomplished by a two-stage metal filling procedure (in particular by plating). Firstly, a substantially horizontal electrically conductive bridge may be formed which may have two opposing concave surfaces. This procedure may be followed by a filling of concave dimples above and below the bridge, for example in one or several further plating procedures.

Advantageously, the described manufacturing architecture does not form a bottle hole when drilling the electrically insulating layer structure (in particular when embodied as a thin core). Moreover, an X-shape of the laser through hole may be prevented which may result in a better stress distribution in the laser via. Furthermore, a higher reliability may be obtained as the risk of bottom separation may be securely avoided. Moreover, an exemplary embodiment of the invention may provide an easier and faster laser processing than, for example, blind via approaches. Furthermore, a filling process of filling the laser through hole with electrically conductive material may be easier, as the via after bridging is presented by a blind via on bottom and a dimple on front side. The reliability of the process of forming such a laser via is high.

In the following, further exemplary embodiments of the method and the component carrier will be explained.

In an embodiment, the first laser drilling and the second laser drilling may be carried out so that the laser through-hole with substantially trapezoidal shape tapers from the back side to the front side. For instance, the tapering may be continuously conical between the front side and the back side. The narrowest portion of the laser through hole may be located at the first electrically conductive layer structure.

In an embodiment, the first laser drilling is carried out without conformal mask on the front side. Correspondingly, the second laser drilling may be carried out without conformal mask on the back side. In particular, the first laser drilling may be carried out without prior formation of a window in the first electrically conductive layer structure. Accordingly, the second laser drilling may be carried out without prior formation of a window in the second electrically conductive layer structure. The formation of a mask and a window on/in the respective electrically conductive layer structure prior to the laser processing may be omitted for instance when the exterior surface of the respective electrically conductive layer structure is provided with a surface treatment (such as black oxide formation) prior to laser processing. Such black oxide may suppress the tendency of laser light to be reflected on the exterior surface of the respective electrically conductive layer structure. Therefore, the method may preferably comprise forming black oxide on an exterior surface of at least one of the first electrically conductive layer structure and the second electrically conductive layer structure prior to laser drilling through the first electrically conductive layer structure or the second electrically conductive layer structure, respectively. However, any other surface treatment procedure may be carried out as well, for instance by carrying out a bond film process or a Z-process. Any pre-treatment for a laser process may be used. As an alternative, a direct laser drilling of a sufficiently thin electrically conductive layer structure is possible as well. For example, direct drilling is possible when the thickness of the respective electrically conductive layer structure is sufficiently thin, for instance 2 µm.

In an embodiment, the first laser drilling may be carried out with a narrower laser beam than the second laser drilling. A consequence of such a processing may be the trapezoidal shape of the laser through hole. This may prevent the formation of stress centers, which may occur in conventional processes resulting in X-shaped laser through holes. What concerns the different sizes of the laser beams during front side drilling and back side drilling, the effect of a front-side to back-side offset may be taken into consideration. If the difference in sizes does not cover the offset, a high overhang may be created on one side, and a defect in the shape may occur which may not be trapezoidal anymore. Hence, the offset should be kept as small as possible.

In an embodiment, the first laser drilling is carried out with a lower laser energy than the second laser drilling. A soft and sufficiently low energetic first laser shot from the front side may ensure that the first laser shot does not extend up to the second electrically conductive layer structure. This may prevent undesired heating and reduction of reliability. In contrast to this, a subsequent hard and sufficiently high energetic second laser shot from the back side may ensure that the previously formed shallow blind hole may be extended so as to obtain a through hole.

In an embodiment, the first laser drilling is carried out for promoting heat transfer in the first electrically conductive layer structure in a horizontal direction and inhibiting heat transfer in a vertical direction. This may advantageously limit the vertical extension of the blind hole after the first laser shot from the front side. Consequently, reliability issues may be prevented.

More specifically, the method may comprise promoting heat transfer in the horizontal direction and inhibiting heat transfer in the vertical direction by operating a laser beam during the first laser drilling at an unstable processing point. In the context of the present application, the term "configuring a laser beam for promoting heat transfer in horizontal direction and inhibiting heat transfer in vertical direction" may particularly denote that at least one parameter characterizing the laser beam, in particular its energy and/or its operating point, is adjusted so that the heat of the laser energy propagates with a larger or major amount in a horizontal direction along the extension of the electrically conductive layer structure rather than vertically into material of the electrically insulating layer structure below. Thus, only a smaller or minor amount of the laser energy may propagate vertically. A highly appropriate design parameter for increasing heat transfer horizontally and simultaneously decreasing heat transfer vertically is the adjustment of the energy of the first laser beam, as will be described below in further detail referring to FIG. 2 and FIG. 3.

In an embodiment, at least one of the first laser drilling and the second laser drilling comprises only a single laser shot. Alternatively, at least one of the first laser drilling and the second laser drilling comprises a plurality of laser shots.

In an embodiment, the method comprises at least partially filling the laser through-hole with electrically conductive filling material, preferably copper. For instance, filling the laser through-hole with the electrically conductive filling material comprises firstly forming a seed layer, for instance by electroless plating, followed by the deposition of additional electrically conductive material, for instance galvanically.

In an embodiment, filling the laser through-hole with the electrically conductive filling material comprises forming lining structures lining slanted sidewalls of the substantially trapezoidal laser through-hole with electrically conductive filling material connecting to the first electrically conductive layer structure and the second electrically conductive layer structures. Correspondingly, the electrically conductive filling material of the laser through-hole of the component carrier may comprise lining structures such as slanted sidewalls of the substantially trapezoidal laser through-hole with electrically conductive filling material connecting the first electrically conductive layer structure and the second electrically conductive layer structures. The trapezoidal shape of the laser through hole is perfectly compatible with the formation of lining structures without undesired voids in an interior thereof. This may ensure a high electrical reliability of the copper filled laser through hole.

In an embodiment, filling the laser through-hole with the electrically conductive filling material comprises forming a substantially horizontal bridge structure connecting the lining structures on the slanted sidewalls. Correspondingly, the electrically conductive filling material of the laser through-hole of the component carrier may comprise a substantially horizontal bridge structure connecting the lining structures on the slanted side-walls. The tapering configuration of the lining structures may result, when continuing a plating process, in the formation of a bridge structure laterally connecting opposing lining structures at a vertical level at which the distance between the lining structures is still relatively small. This may promote the formation of a free hanging bridge structure with high reliability. In particular, a free hanging, asymmetrical bridge structure located out of a vertical center of the through hole can be obtained.

In an embodiment, filling the laser through-hole with the electrically conductive filling material comprises at least partially filling remaining gaps above and/or below the bridge structure and laterally between the lining structures with further electrically conductive filling material. After the lining structures and the bridge structure have formed a substantially H-shaped structure (however with slanted long legs of the H), a continuation of a copper plating procedure may reliably fill the remaining gaps above and below the bridge structure and laterally between opposing lining structures.

In another embodiment, the method comprises carrying out the first opening process as a plasma process or as a patterning of a photoimageable dielectric. Thus, the first opening process can also be done with a plasma or a PID process, as an alternative to a laser process.

In an embodiment, at least one of the material interfaces between the electrically conductive filling structure and the respective one of the electrically conductive layer structures may be substantially beak-shaped. In the context of the present application, the term "beak-shaped" may particularly denote a structure being shaped similar as a triangle or a "V". It may have the shape similar as the beak of a bird. In particular, the narrow tips of the beak-shaped material interfaces may be oriented inwardly while the wider portions of the beak-shaped material interfaces may be oriented outwardly (compare FIG. 6). A substantially beak-shaped material interface may be in particular substantially V-shaped or substantially U-shaped. Such a shape may be promoted by an overhang of one or both ends of one or both of the electrically conductive layer structures after formation of a window by laser drilling.

In an embodiment, the material interfaces between the electrically conductive filling structure and the respective one of the electrically conductive layer structures are located at or next to corners of the electrically insulating layer structure between the electrically conductive filling structure on the one hand and a respective one of the first electrically conductive layer structure and the second electrically conductive layer structure on the other hand. They may however be shifted inwardly or outwardly at the level of the respective electrically conductive layer structure depending on certain manufacturing factors (for instance depending on an overhang of a respective electrically conductive layer structure beyond the electrically insulating layer structure next to the laser through hole and/or depending on a lateral offset between the front side laser beam in the back side laser beam).

In an embodiment, the material interfaces are copper/copper interfaces. In particular copper material provided by a copper foil and copper material provided by plating (in particular formed by electroless plating and/or galvanically plating) may be properly distinguished when experimentally analyzing a cross-section of a component carrier. Even sections of the electrically conductive filling structure formed in different plating stages may be distinguished when experimentally analyzing a cross-section of a component carrier.

In an embodiment, the electrically conductive filling material of the laser through-hole comprises gap filling structures. These may include a first gap filling structure filling at least partially a remaining gap above the bridge structure and/or a second gap filling structure filling at least partly a remaining gap below the bridge structure. In other words, the respective gap may be completely filled with electrically conductive material. In such a scenario, an upper surface of the electrically conductive filling structure may be planar and aligned with an upper surface of the first electrically conductive layer structure. Correspondingly, a lower surface of the electrically conductive filling structure may then be planar and aligned with a lower surface of the second electrically conductive layer structure. However, it is alternatively also possible that the respective gap is only partially filled with metallic material of the electrically conductive filling structure. In such a scenario, a recess may remain at an upper surface and/or a lower surface of the electrically conductive filling structure.

The upper gap may be defined on a bottom side by an upper concave surface of the bridge structure. The lower gap may be defined on a top side by a lower concave surface of the bridge structure. Thus, a surface of the bridge structure on the front side may be concave. It is also possible that a surface of the bridge structure on the back side is concave. In view of the trapezoidal shape and the corresponding tapering geometry, the concave surface of the bridge structure on the back side may have a larger curvature than the concave surface of the bridge structure on the front side.

In an embodiment, the component carrier comprises at least one further material interface between the lining structures and at least one of the gap filling structures and/or between the bridge structure and at least one of the gap filling structures. Since the lining structures, the bridge structure and the gap filling structures may be manufactured in different, subsequent plating stages, they may be distinguished by experimentally analyzing a cross-section of the component carrier.

In an embodiment, a laterally exterior surface of the electrically conductive filling material has a slanted substantially straight shape. The sidewall of the electrically conductive filling material may therefore be free of edges or bottlenecks which may conventionally constitute stress zones. Consequently, the reliability of the component carrier may be improved.

In an embodiment, a narrowest exterior diameter of the electrically conductive filling material is located on the front side. From this front side, the diameter of the electrically conductive filling material may continuously increase up to the back side. This geometry may suppress the tendency of forming undesired material-free voids in an interior of the electrically conductive filling structure (as it may occur with a laser through hole having an X-shape).

In an embodiment, a vertical thickness of the electrically insulating layer structure is less than 110 µm, in particular less than 60 µm. Thus, the described method is particularly advantageous for forming laser through holes in relatively thin cores.

In an embodiment, a ratio between a smaller side length of the trapezoid at the first electrically conductive layer structure and a larger side length of the trapezoid at the second electrically conductive layer structure may be in a range between 0.6 and 0.8. The two sides with smaller and larger side length may be parallel to one another. In particular when the mentioned value is 0.6 or more, this may reliably prevent excessive overhang and may result in a proper reliability. In order to prevent defects such as residues and overhang, the mentioned value should not be too high, for instance can be up to 0.8.

In an embodiment, the component carrier comprises a stack of at least one electrically insulating layer structure and at least two electrically conductive layer structures. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e., planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. These components may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

A substrate or interposer may comprise or consist of at least a layer of glass, silicon, ceramic and/or organic material (like resin). A substrate or interposer may also comprise a photoimageable or dry-etchable organic material like epoxy-based build-up film or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin, more specifically FR-4 or FR-5), cyanate ester, polyphenylene derivate, glass (in particular glass fibers, glass-spheres, multi-layer glass, glass-like materials), prepreg material, photoimageable dielectric material, polyimide, polyamide, liquid crystal polymer (LCP), epoxy-based build-up material, polytetrafluoroethylene (teflon), a ceramic, and a metal oxide. Reinforcing materials such as webs, fibers or spheres, for example made of glass (multilayer glass) may be used as well. Although prepreg, FR4, or epoxy-based build-up film or photoimageable dielectrics are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

It is also possible to provide the component carrier with at least one surface mounted and/or embedded component. The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a further component carrier (for example a printed circuit board, a substrate, or an interposer) in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
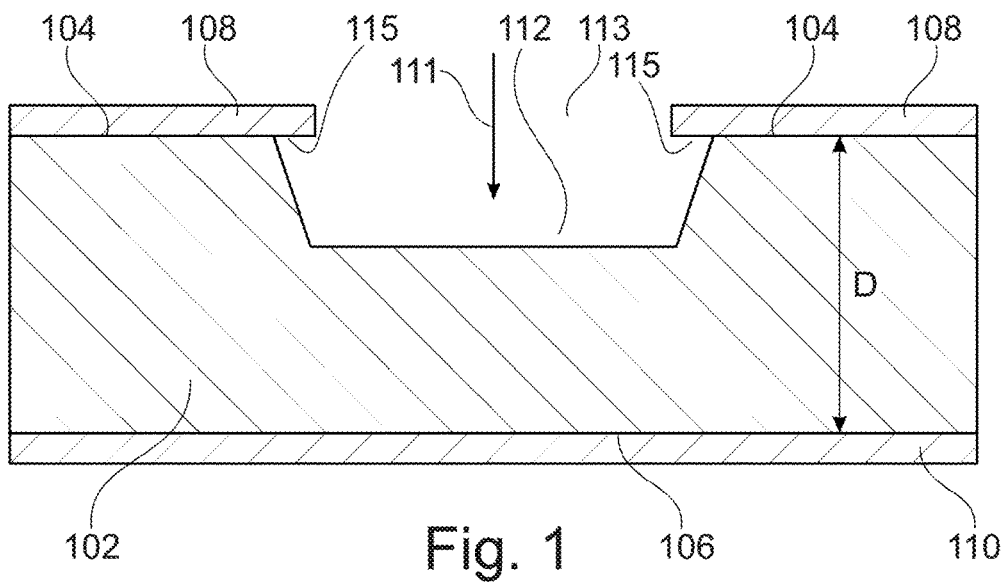
FIG. 1 and FIG. 4, FIG. 5 and FIG. 6 illustrate cross-sectional views of structures obtained during carrying out a method of manufacturing a component carrier with a laser through hole, shown in FIG. 6, by a double laser shot treatment from opposing sides according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

A conventional shortcoming in the formation of laser vias is related to a bottle hole or bottle neck which may occur in particular when using a thin core (in particular having a thickness of less than 110 µm, more particularly of less than 60 µm) as electrically insulating layer structure to be laser drilled. Heat from a first laser shot on the front side extending through a front side electrically conductive layer structure and into the electrically insulating layer structure may induce a damage of the back side electrically conductive layer structure (in particular a bottom copper foil). Such a damaged area cannot be drilled with high precision on the bottom side which results in a high reliability risk.

A gist of an exemplary embodiment of the invention is to render a laser via formation process reliable, in particular in terms of the formation of a laser through hole for a thin core (in particular an electrically insulating layer structure having a thickness of less than 110 µm, in particular of less than 60 µm). Indeed, when forming a conventional laser through hole with X-shape with a $CO_2$ laser in a thin core, there is a high risk of bottle holes that are induced by the first shot (which can also be multiple first shots) from the front side which may undesirably reach up to the bottom copper. Such a bottle hole may modify the structure and may prevent accurate drilling of the other side. Such bottle holes may involve a very critical reliability concern. Undesired bottle hole formation may lead to separation, inclusions, cracks and other electrical defects.

In order to avoid at least part of the mentioned and/or other shortcomings, an exemplary embodiment of the invention forms the top opening extending through the upper electrically conductive layer structure and part of the electrically insulating layer structure with a soft (in terms of energy impact) laser shot. Highly advantageously, an intentionally unstable laser shot may be adjusted so that the laser energy may tend to open more copper of the top electrically conductive layer structure on the front side than diffusing to the bottom side and damaging the copper of the bottom electrically conductive layer structure beneath. Then on the bottom side, one or more subsequent laser shots can be set up in a way to remove remaining dielectric material (in particular resin and glass) of the electrically insulating layer structure and provide a stable and well-defined opening in form of the laser through hole having trapezoidal shape. Thus, an exemplary embodiment of the invention may avoid a conventional X-shape which may be undesired in particular for thin cores, as the X-shape may induce a higher stress concentration in the laser through-hole neck and may therefore constitute a mechanical weakness that might reduce the reliability of the vias.

In addition, to fill such via on thin cores, there is no need for a special bridge plating process according to an exemplary embodiment of the invention. Indeed, a galvanic copper plating process with well controlled parameters may be enough to close the top opening and fill the rest of the via, or part thereof.

In a preferred embodiment, the trapezoid laser through-hole may have a shape characterized by a ratio between top and bottom diameters of at least 0.7, preferably at least 0.8 to reliably avoid bottle holes or bottlenecks. Advantageously, the trapezoidal shaped laser through hole may have a continuous taper between the top end and the bottom end, i.e. may have no X-shape. This may contribute to the avoidance of stress concentration in the neck of the X-shape that may conventionally result in a high glass protrusion. What concerns a plating procedure for filling the laser through hole, it may be advantageous to fill the top side first to create a blind via. Advantageously, the first laser shot(s) may be configured as a soft (i.e., not extending up to the opposing second electrically conductive layer structure) unstable laser shot to avoid bottle holes.

By forming a trapezoidal shaped through hole instead of an X-shaped through hole according to an exemplary embodiment of the invention, a smaller diameter on one side and a taper from top to bottom may be achieved. This may improve the quality of the laser through hole since undesired bottle holes may be avoided and a higher reliability may be achieved. Furthermore, a simple and fast filling of the trapezoidal shaped laser through hole may be possible.

The following figure description illustrates an example of the formation of a laser through-hole by laser drilling through a thin core.

FIG. 1 illustrates a cross-sectional view of a structure obtained during performance of a method of manufacturing a component carrier 100 with a laser via by a double laser shot treatment according to an exemplary embodiment of the invention.

Before starting the laser processing, an electrically insulating layer structure 102 having a front side 104 and a back side 106 is provided. For instance, the electrically insulating layer structure 102 may be made of a fully cured dielectric material (for instance a fully cured resin such as an epoxy resin with reinforcing particles therein, for instance glass fibers or glass spheres). For instance, the electrically insulating layer structure 102 may be embodied as (in particular relatively thin) core made of prepreg or FR4 material. A vertical thickness, D, of the electrically insulating layer structure 102 may be for example 80 µm.

As shown in FIG. 1, the front side 104 of the electrically insulating layer structure 102 is covered with a first electrically conductive layer structure 108. The first electrically conductive layer structure 108 may for example be a metal layer such as a copper foil. Correspondingly, the back side 106 of the electrically insulating layer structure 102 is covered by a second electrically conductive layer structure 110. The second electrically conductive layer structure 110 may for example be a metal layer such as a copper foil.

In order to render a subsequent laser processing of the electrically conductive layer structures 108, 110 more efficient, the respectively exterior main surface of the layer structures 108, 110 may be provided with an exterior black oxide layer (not shown) prior to laser drilling. The black oxide may suppress reflection of a laser beam at the respective layer structure 108, 110 and may therefore allow direct removal of the copper material of the respective layer structure 108, 110 without formation of a window in the respective layer structure 108, 110 prior to the laser processing. Thus, the first laser drilling may be carried out without a conformal mask on the front side 104.

Hence, a first laser drilling procedure may be carried out by directing a first laser beam (schematically indicated by an arrow 111) directly through the first electrically conductive layer structure 108 and into the electrically insulating layer structure 102 from the front side 104 to thereby form a window 113 in the first electrically conductive layer structure 108 and a blind hole 112 in the electrically insulating layer structure 102.

The energy of the first laser beam may be so small that only a shallow blind hole 112 is formed in the electrically insulating layer structure 102 so as to prevent the first laser beam from reaching the second electrically conductive layer structure 110. As will be described in further detail below referring to FIG. 2 and FIG. 3, the first laser drilling can be carried out for promoting heat transfer in the first electrically conductive layer structure 108 in horizontal direction and inhibiting heat transfer in vertical direction. This can be accomplished by operating the first laser beam during the first laser drilling at an instable processing point, compare reference numeral 222 in FIG. 3. Descriptively speaking, the front side drilling according to FIG. 1 may use an instable laser shot.

The first laser drilling procedure illustrated in FIG. 1 may be carried out by a single laser shot only or by a sequence of a plurality of laser shots. For the described laser processing, it is for example possible to use a $CO_2$ laser, an excimer laser or a UV laser.

As a result of the processing according to FIG. 1, a through hole extending only through the first electrically conductive layer structure 108 and the connected blind hole 112 extending through only an upper portion of the electrically insulating layer structure 102 may be opened. During this process, glass and resin of the electrically insulating layer structure 102 is removed while simultaneously creating a taper and avoiding an X-shape.

As can be taken from FIG. 1, there may remain a slight overhang 115 of the first electrically conductive layer structure 108 laterally beyond the electrically insulating layer structure 102 after the first laser shot. In other words, the lateral width of the window 113 may be slightly smaller than the maximum lateral width of the blind hole 112. However, due to the described processing with a soft laser shot preferably in an unstable operation state, the size of the overhang 115 can be kept very small.

Figure 2:
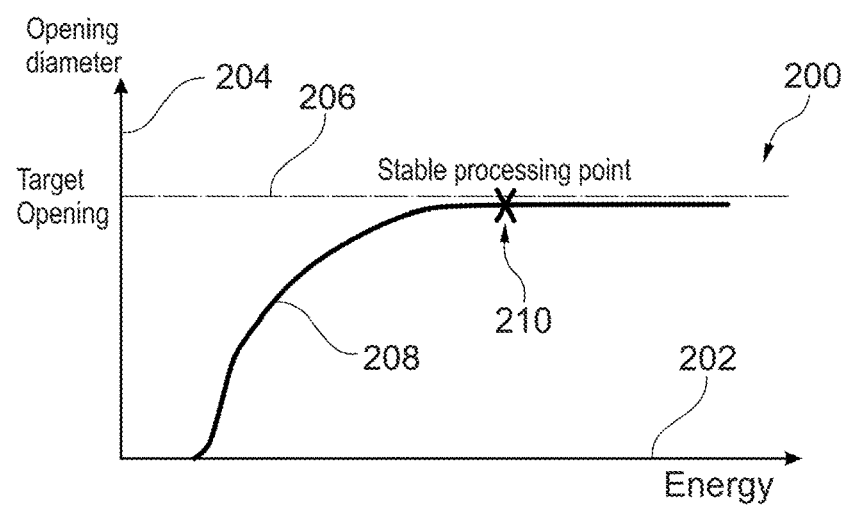
FIG. 2 illustrates a diagram showing a dependency between the energy of a laser beam and an opening diameter of a window in an electrically conductive layer structure in an operation mode with a stable processing point.

FIG. 2 illustrates a diagram 200 showing a dependency between the energy (plotted along an abscissa 202) of a laser beam and an opening diameter (plotted along an ordinate 204) or size of window 113 in an operation mode with a stable processing point 210. The mentioned dependency is indicated by a curve 208.

The curve 208 of the diagram 200 shows that when the energy increases, the size or opening diameter of the window 113 increases as well. In a low energy region, the curve 208 increases with a significant slope. From a certain energy onwards, the described dependency is no longer valid: In contrast to this, the curve 208 approaches at higher energy levels a plateau or asymptote indicated as target opening 206 in FIG. 2. In this region, a further increase of the laser energy does not result in a significant further increase of the opening diameter of the window 113. Descriptively speaking, the additional energy in this regime will then result in a significant burning of resin material of the electrically insulating layer structure 102.

During copper opening (more generally during opening window 113 in the first electrically conductive layer structure 108 by the first laser beam), the laser energy is high and when processing in the stable zone around stable processing point 210 (maximum copper opening for a given aperture or mask), the heat tends to dissipate in the via depths to remove more resin and reach the bottom or on the via wall to remove and burn more resin and then create a pronounced overhang 115 as the copper opening does not get larger. In the context of the present application, the term "overhang" may particularly denote a length of the electrically conductive layer structure directly adjacent to the window over which length the respective portion of the electrically conductive layer structure hangs freely in a cantilever fashion spaced with regard to the electrically insulating layer structure and is not supported from below by material of the electrically insulating layer structure along the extension of the overhang. What concerns the above statement that overhanging material may be locally not supported, it should be said that the overhang may relate to the substantially resin free area beneath the respective electrically conductive layer structure. However, a person skilled in the art will understand that some residue resin might be even present within a gap relating to the overhang. In order to quantitatively determine or measure the value of the overhang, the length of the substantially resin-free (wherein resin may refer to the electrically insulating layer structure) undercut directly under an overhanging electrically conductive layer structure may be measured (in particular even if it is not the most receding point or total relief below the overhanging electrically conductive layer structure, for example copper layer). In other words, for measuring the overhang, the undercut directly below the electrically conductive layer structure may be measured.

In an exemplary embodiment, the overhang may be slightly asymmetrical due to the described processing, and also due to the effect of front side-to-back side offset.

It can therefore be concluded from FIG. 2 that the mere increase of the laser energy does not lead to the desired result of a reduced overhang 115.

Figure 3:
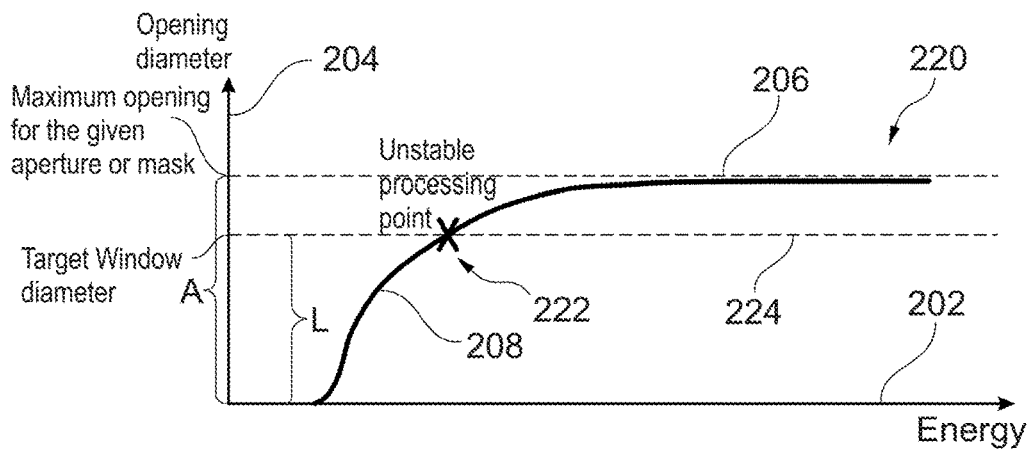
FIG. 3 illustrates a diagram showing a dependency between the energy of a laser beam and an opening diameter of a window in an electrically conductive layer structure in an operation mode according to an exemplary embodiment of the invention with an unstable processing point.

FIG. 3 illustrates a further diagram 220 showing a dependency between the energy (again plotted along abscissa 202) of the first laser beam according to FIG. 1 and the opening diameter (plotted again along ordinate 204) or size of window 113 in an operation mode according to an exemplary embodiment of the invention with an instable processing point 222. Descriptively speaking, an exemplary embodiment of the invention does not intend to adjust the energy of the first laser beam so as to operate the laser at the stable processing point 210 as close as possible at the maximum opening for the given aperture or mask. In contrast to this, an exemplary embodiment of the invention operates the laser and correspondingly adjust the laser energy so as to operate the first laser beam at the instable processing point 222.

By opening window 113 by the first laser beam adjusted at the instable processing point 222, it is highly advantageously possible to promote a horizontal heat dissipation by giving more room to open the window 113 in the copper material of the first electrically conductive layer structure 108 rather than drilling a deeper via.

In the instable processing point 222 above, the provided laser beam energy may be mostly used and focused on opening the window 113 in the first electrically conductive layer structure 108 and creating larger via while only a portion of the dielectric material of the electrically insulating layer structure 102 will be removed. In this case, the overhang 115 may be advantageously lower. As a result, there will also be no risk for bottle holes during formation of the laser through hole.

In view of the foregoing, a preferred embodiment of the invention forms the window 113 in the first electrically conductive layer structure 108 and removes material of the electrically insulating layer structure 102 below the window 113 by the first laser beam being configured for promoting heat transfer in the first electrically conductive layer structure 108 in horizontal direction and inhibiting heat transfer in vertical direction (which would only remove more material of the electrically insulating layer structure 102). More specifically, the method may comprise promoting heat transfer in a horizontal direction and inhibiting heat transfer in the vertical direction by correspondingly adjusting the energy impact of the first laser beam on the first electrically conductive layer structure 108 and the electrically insulating layer structure 102 in accordance with the unstable processing point 222.

In a particularly preferred embodiment and again referring to FIG. 3, the method comprises adjusting the energy of the first laser beam so that the size L of the window 113 (compare target window diameter 224) is obtained which is sufficiently smaller than a maximum opening size A for a given aperture. The size L of the window 113 corresponds to the unstable processing point 222, whereas the maximum opening size A substantially corresponds to a stable processing point 210 shown in FIG. 2. In such a scenario, a particularly small overhang 115 may be obtained.

Figure 4:
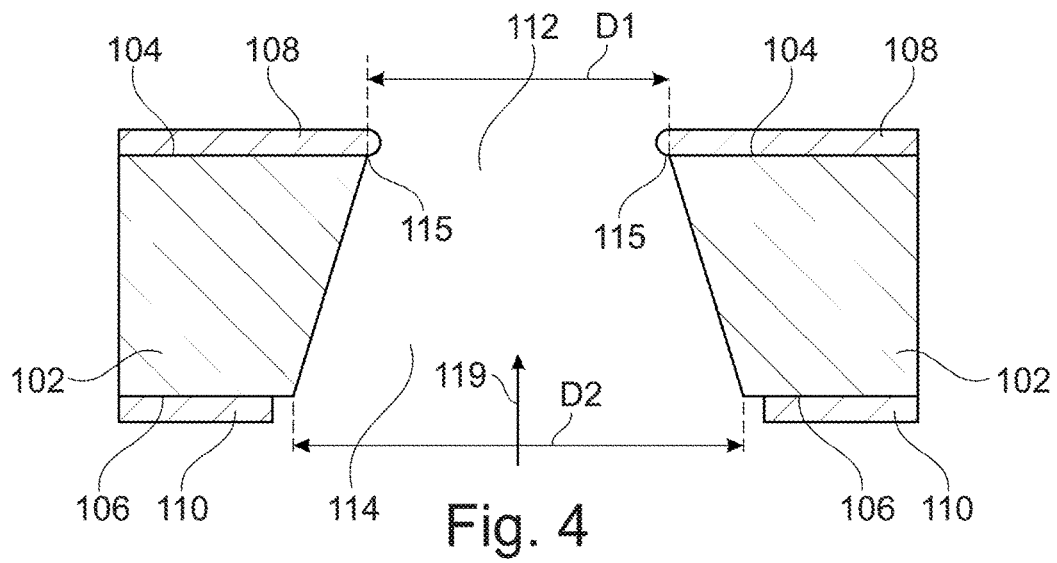

FIG. 4 illustrates a cross-sectional view of a structure obtained during performance of a method of manufacturing the component carrier 100 with the laser via by the double laser shot treatment according to the presently described exemplary embodiment of the invention. In particular, FIG. 4 illustrates the result of a second laser drilling stage following the first laser drilling stage of FIG. 1.

Also, the second laser drilling is carried out without a conformal mask on the back side 106 and without prior formation of a window in the second electrically conductive layer structure 110. Preferably after having formed black oxide on an exterior surface of the second electrically conductive layer structure 110, the second laser drilling procedure may be performed or carried out from the back side 106. Thus, a second laser beam, as indicated by an arrow 119, may be directed onto and may propagate through the second electrically conductive layer structure 110 and subsequently through the electrically insulating layer structure 102 from the back side 106. The second laser beam is configured so that the previously formed blind hole 112 is extended so as to be converted into a laser through-hole 114 with a substantially trapezoidal shape, as shown in FIG. 4. The second laser drilling is carried out so that the laser through-hole 114 with substantially trapezoidal shape tapers from the back side 106 to the front side 104.

In order to obtain the trapezoidal shape shown in the cross-sectional view of FIG. 4 (corresponding to a frusto-conical shape in three dimensions), the first laser drilling is carried out with a spatially laterally narrower laser beam than the second laser drilling. Back side drilling may be carried out with larger laser beam diameter than front side drilling. Moreover, the softer first laser drilling is performed with a lower laser energy than the harder second laser drilling. The described second laser drilling may be performed using only a single laser shot or a plurality of subsequent laser shots.

Still referring to FIG. 4, a ratio between a smaller side length, D1, of the trapezoid at the first electrically conductive layer structure 108 and a larger side length, D2, of the trapezoid at the second electrically conductive layer structure 110 may be for instance 0.7. This design rule has turned out as highly advantageous for preventing excessive overhang. As a result, a high degree of reliability of the formed laser through hole and consequently a high degree of electrically reliability of the component carrier 100 obtained after filling the laser through hole with copper material may be achieved.

Figure 5:
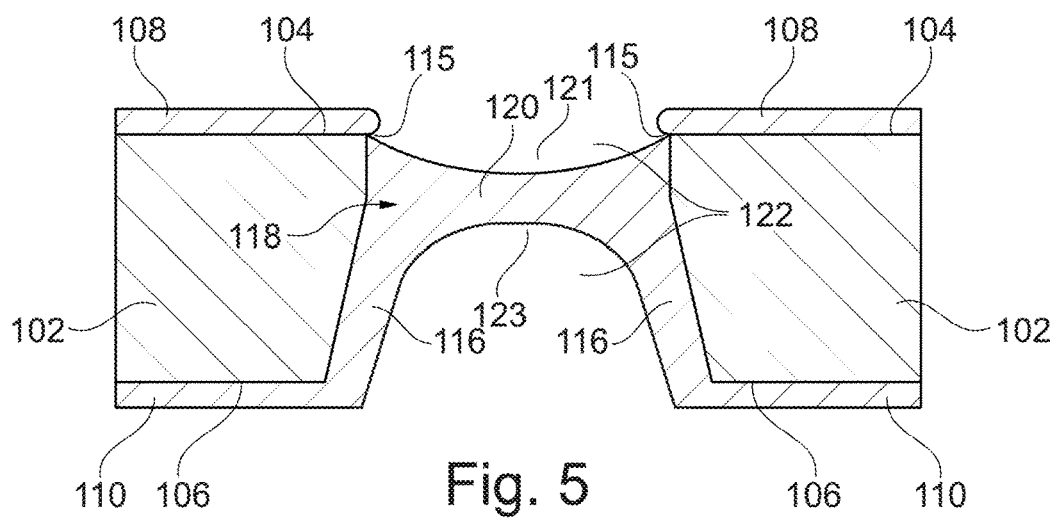

Preferably, a lateral offset between the center of the first laser beam irradiated from the front side 104 and the center of the second laser beam irradiated from the back side 106 should be small. Preferably, this offset may be adjusted to be lower than 15 μm to avoid a long overhang (see reference numeral 115 in FIG. 1) on the top side. FIG. 5 shows a small or short offset 115 only on the front side 104, i.e., the side of the first electrically conductive layer structure 108. However, a small or short offset may occur also on the back side 106, i.e., the side of the second electrically conductive layer structure 110.

FIG. 5 illustrates a cross-sectional view of a structure obtained during performance of the method of manufacturing the component carrier 100 with the laser via by the double laser shot treatment according to an exemplary embodiment of the invention. Copper plating has already been partially carried out according to FIG. 5.

More specifically, FIG. 5 shows the result of a first partial filling of the laser through hole 114 with electrically conductive material such as copper. Although not shown in the figures, filling the laser through-hole 114 with electrically conductive filling material 118 may comprise firstly forming a very thin seed layer of copper by electroless plating. This seed layer may then be used for applying an electric current for subsequently galvanically depositing additional electrically conductive material. It is possible that the seed layer has a thickness above 1 μm and/or that several cumulative seed layers are provided. For example, a thickness of a seed layer or a cumulative thickness of a plurality of seed layers may be in a range between 0.5 μm and 5 μm. When multiple seed layers are provided, they may comprise an organic (for instance polymer) layer, a palladium layer, and/or a copper layer.

As shown in FIG. 5 and preferably after having formed the above described seed layer, the procedure may then comprise filling the laser through-hole 114 with lining structures 116 of the electrically conductive filling material 118 lining slanted sidewalls of the substantially trapezoidal laser through-hole 114 with copper or other appropriate electrically conductive material. As shown in FIG. 5, the lining structures 116 are connected to the first electrically conductive layer structure 108 and the second electrically conductive layer structures 110.

Furthermore, filling the laser through-hole 114 with the electrically conductive filling material 118 by copper plating comprises forming a substantially horizontal bridge structure 120 connecting the lining structures 116 on the slanted sidewalls. In view of the substantially trapezoidal shape of the laser through hole 114, a vertical center of the bridge structure 120 is located closer to the first electrically conductive layer structure 108 than to the second electrically conductive layer structure 110. Hence, bridging the lining structures 116 by the bridge structure 120 may form a vertically upwardly shifted neck. Thus, FIG. 5 shows a free hanging, asymmetrical bridge structure 120 located out of a vertical center of the through hole 114.

As can be taken from FIG. 5 as well, an upper surface of the bridge structure 120 is concave and therefore forms a dimple 121 on the front side 104, i.e., on the side facing the first electrically conductive layer structure 108. Also, the lower surface of the bridge structure 120 is concave. Thus, the described plating procedure also forms a blind via 123 (which may also be denoted as further dimple) on the bottom side of the bridge structure 120, i.e., on the side facing the second electrically conductive layer structure 110. As can be taken from FIG. 5, the concave surface of the bridge structure 120 on the back side 106 has a larger curvature than the concave surface of the bridge structure 120 on the front side 104. Moreover, a laterally exterior surface of the electrically conductive filling material 118 has a slanted substantially straight shape.

Figure 6:
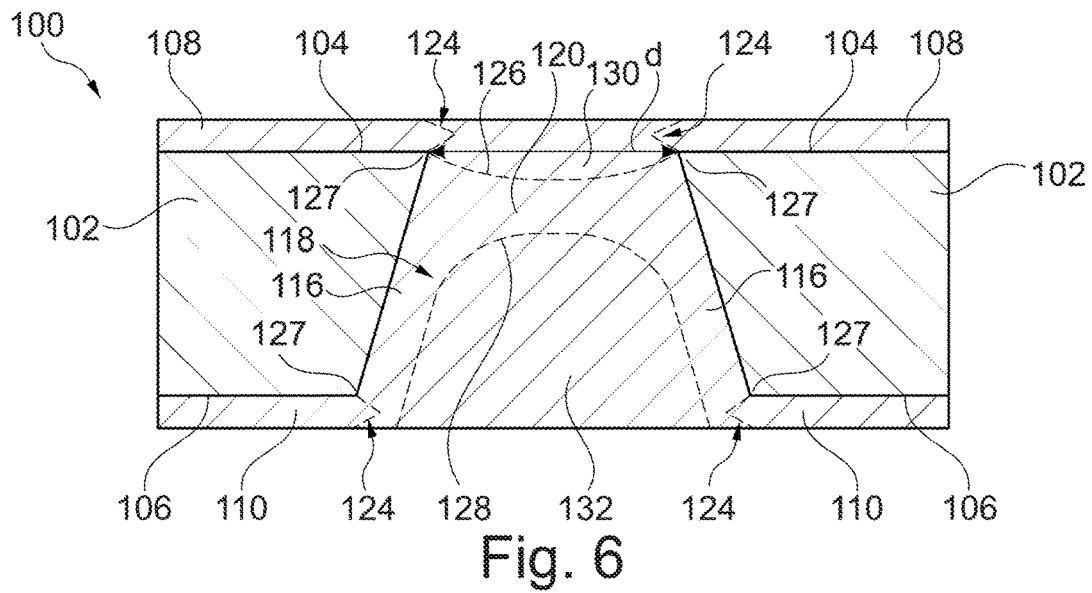

FIG. 6 illustrates a cross-sectional view of the manufactured component carrier 100 with a laser generated via according to an exemplary embodiment of the invention.

FIG. 6 shows the final result of the plating procedure of the described exemplary embodiment in which the laser through hole 114 has been completely filled with electrically conductive filling material 118 (copper in the described embodiment). It should however be said that, as an alternative to the illustration of FIG. 6, it may be also possible to only partially fill remaining gaps 122 of the structure according to FIG. 5 with electrically conductive filling material 118. For example, an unfilled recess may remain on one or both sides of the bridge structure 120, for instance in the form of dips of the electrically conductive filling material 118 at the vertical height of one or both of the electrically conductive layer structures 108, 110.

More specifically, filling the laser through-hole 114 with the electrically conductive filling material 118 may be continued for filling remaining gaps 122 above and below the bridge structure 120 with further electrically conductive filling material 118. In other words, the dimple 121 as well as the blind via 123 may be filled as well with copper by continued plating.

For instance, the described filling procedure may result in the same shape as a blind via but with two foil copper openings.

As a result of the described manufacturing procedure, the component carrier 100 according to FIG. 6 can be obtained. For instance, the component carrier 100 may be a laminate-type plate-shaped printed circuit board (PCB).

In particular and as a result or fingerprint of the described manufacturing process, beak-shaped material interfaces 124 are formed in interface regions between the first electrically conductive layer structure 108 and the electrically conductive filling material 118 and between the second electrically conductive layer structure 110 and the electrically conductive filling material 118. The material interfaces 124 are shown with dotted or dashed lines in FIG. 6. For instance, the beak-shaped material interfaces 124 may have a substantial V-shape or U-shape when viewing the cross-sectional view of an actually manufactured component carrier 100 of the type shown in FIG. 6. In the shown embodiment, the beak-shaped material interfaces 124 are located directly adjacent to corners 127 of the electrically insulating layer structure 102 between the electrically conductive filling structure 118 on the one hand and a respective one of the first electrically conductive layer structure 108 and the second electrically conductive layer structure 110 on the other hand. Although the material interfaces 124 are copper/copper interfaces, a skilled person is aware of the fact that the material interfaces 124 are visible when experimentally analyzing a cross-section of a component carrier 100. Copper foils constituting the electrically conductive layer structures 108, 110 can be properly distinguished by experimental analysis from galvanically plated copper which forms the electrically conductive filling material 118.

Correspondingly, further material interfaces 126, 128 between the lining structures 116 and the gap filling structures 130, 132 and between the bridge structure 120 and the gap filling structures 130, 132 can be clearly detected by routine experimental analysis. A first gap filling structure 130 filling a remaining gap (compare dimple 121) above the bridge structure 120, and a second gap filling structure 132 filling a remaining gap (compare further dimple or blind via 123) below the bridge structure 120 are shown in FIG. 6.

As shown in FIG. 6 as well, a narrowest exterior diameter, d, of the electrically conductive filling material 118 is located on the front side 104.

It should be said that the shape and position of the first material interfaces 124 may depend on the exact processing. For instance, when there is a larger value of the overhang 115, the beak-shaped first material interfaces 124 may be shifted inwardly. The first material interfaces 124 may also be shifted laterally in the presence of a larger offset, which is described above. It is also possible that the concavity at the further material interfaces 126, 128 may deviate from the illustration of FIG. 6, when the exact process flow is different.

It should be noted that the term "comprising" does not exclude other elements or steps and the "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method of manufacturing a component carrier, comprising:
   providing an electrically insulating layer structure having a front side and a back side, wherein the front side is covered by a first electrically conductive layer structure and the back side is covered by a second electrically conductive layer structure;
   carrying out a first opening process with a first laser drilling, through the first electrically conductive layer structure and into the electrically insulating layer structure from the front side to thereby form a blind hole in the electrically insulating layer structure;
   thereafter carrying out a second opening process with a second laser drilling, through the second electrically conductive layer structure and through the electrically insulating layer structure from the back side to thereby extend the blind hole into a through hole with a substantially trapezoidal shape, wherein at least one of the first and the second electrically conductive layer structures comprises an overhang extending into the through hole and spaced with regard to the electrically insulating layer structure, forming material interfaces in regions between the first electrically conductive layer structure and an electrically conductive filling material and between the second electrically conductive layer structure and the electrically conductive filling material, wherein at least one of the material interfaces is beak-shaped.

2. The method according to claim 1, further comprising at least one of the following features:

wherein the first laser drilling and the second laser drilling are carried out so that the through-hole with substantially trapezoidal shape tapers from the back side towards the front side;

wherein the first laser drilling is carried out without a conformal mask on the front side;

wherein the second laser drilling is carried out without a conformal mask on the back side;

wherein the first laser drilling is carried out without prior formation of a window in the first electrically conductive layer structure;

wherein the second laser drilling is carried out without prior formation of a window in the second electrically conductive layer structure;

wherein the first laser drilling is carried out with a narrower laser beam than the second laser drilling;

wherein the first laser drilling is carried out for promoting heat transfer in the first electrically conductive layer structure in a horizontal direction and inhibiting heat transfer in a vertical direction by operating a laser beam during the first laser drilling at an unstable processing point;

wherein at least one of the first laser drilling and the second laser drilling comprises only a single laser shot;

wherein at least one of the first laser drilling and the second laser drilling comprises a plurality of laser shots;

wherein the method comprises carrying out a surface treatment forming black oxide or providing a bond film, on an exterior surface of at least one of the first electrically conductive layer structure and the second electrically conductive layer structure prior to laser drilling through the first electrically conductive layer structure or the second electrically conductive layer structure, respectively;

wherein the method comprises carrying out the first opening process as a plasma process or as a process of patterning a photo imageable dielectric.

3. The method according to claim 1, wherein the method comprises at least partially filling the through-hole with electrically conductive filling material.

4. The method according to claim 3, wherein filling the through-hole with the electrically conductive filling material comprises firstly forming a seed layer by electroless plating, followed by the deposition of additional electrically conductive material galvanically.

5. The method according to claim 3, wherein filling the through-hole with the electrically conductive filling material comprises forming lining structures lining slanted sidewalls of the substantially trapezoidal through-hole with electrically conductive filling material connecting to the first electrically conductive layer structure and the second electrically conductive layer structure.

6. The method according to claim 5, wherein filling the through-hole with the electrically conductive filling material comprises forming a substantially horizontal bridge structure connecting the lining structures.

7. The method according to claim 6, wherein filling the through-hole with the electrically conductive filling material comprises at least partially filling remaining gaps above and below the bridge structure and laterally between the lining structures with further electrically conductive filling material.

8. A component carrier, comprising:

an electrically insulating layer structure having a front side and a back side;

a first electrically conductive layer structure covering the front side of the electrically insulating layer structure;

a second electrically conductive layer structure covering the back side of the electrically insulating layer structure;

a through hole having a substantially trapezoidal shape extending through the first electrically conductive layer structure, the electrically insulating layer structure and the second electrically conductive layer structure;

electrically conductive filling material filling at least part of the through hole;

wherein material interfaces are formed in interface regions between the first electrically conductive layer structure and the electrically conductive filling material and between the second electrically conductive layer structure and the electrically conductive filling material, wherein at least one of the first and the second electrically conductive layer structures comprises an overhang extending into the through hole and spaced with regard to the electrically insulating layer structure, wherein at least one of the material interfaces is beak-shaped.

9. The component carrier according to claim 8, comprising at least one of the following features:

wherein at least part of the material interfaces is located next to corners of the electrically insulating layer structure between the electrically conductive filling structure;

and wherein at least part of the material interfaces is located next to a respective one of the first electrically conductive layer structure and the second electrically conductive layer structure;

wherein the material interfaces are copper/copper interfaces.

10. The component carrier according to claim 8, wherein the electrically conductive filling material comprises lining structures lining slanted sidewalls of the substantially trapezoidal through-hole with electrically conductive filling material connecting to the first electrically conductive layer structure and to the second electrically conductive layer structure.

11. The component carrier according to claim 10, wherein the electrically conductive filling material comprises a substantially horizontal bridge structure connecting the lining structures on the slanted sidewalls.

12. The component carrier according to claim 11, wherein the electrically conductive filling material comprises a first gap filling structure filling a remaining gap above the bridge structure and/or a second gap filling structure filling a remaining gap below the bridge structure.

13. The component carrier according to claim 12, further comprising:
- at least one further material interface between the lining structures and at least one of the gap filling structures and/or between the bridge structure and at least one of the gap filling structures.

14. The component carrier according to claim 11,
wherein a surface of the bridge structure facing the front side is concave.

15. The component carrier according to claim 11,
wherein a surface of the bridge structure facing the back side is concave.

16. The component carrier according to claim 14,
wherein a surface of the bridge structure facing the back side is concave, and wherein the concave surface of the bridge structure facing the back side has a larger curvature than the concave surface of the bridge structure facing the front side.

17. The component carrier according to claim 8,
wherein a laterally exterior surface of the electrically conductive filling material has a slanted substantially straight shape such that a narrowest exterior diameter of the electrically conductive filling material is located on the front side.

18. The component carrier according to claim 8,
wherein a thickness of the electrically insulating layer structure is less than 110 µm.

19. The component carrier according to claim 8,
wherein a ratio between a smaller side length of the trapezoid at the first electrically conductive layer structure and a larger side length of the trapezoid at the second electrically conductive layer structure is in a range between 0.6 and 0.8.

20. The component carrier according to claim 8, further comprising at least one of the following features:
- a component mounted on and/or embedded in the electrically insulating layer structure and/or at least one of the electrically conductive layer structures, wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip;
- wherein at least one of the electrically conductive layer structures is at least one of the group consisting of copper, aluminum, nickel, silver, gold, palladium, and tungsten, any of the mentioned materials being optionally coated with a supra-conductive material such as graphene;
- wherein the electrically insulating layer structure comprises at least one of the group consisting of resin, reinforced or non-reinforced resin, epoxy resin or bis-maleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
- wherein the component carrier is shaped as a plate;
- wherein the component carrier is configured as one of the group consisting of a printed circuit board, and a substrate;
- wherein the component carrier is configured as a laminate-type component carrier.

* * * * *